United States Patent
Kim

(10) Patent No.: US 7,532,262 B2
(45) Date of Patent: May 12, 2009

(54) SYSTEM FOR MANUFACTURING A FLAT PANEL DISPLAY

(75) Inventor: Dong-Byum Kim, Seoul (KR)

(73) Assignee: Samsung Electronics Co., Ltd., Suwon-si, Gyeonggi (KR)

( * ) Notice: Subject to any disclaimer, the term of this patent is extended or adjusted under 35 U.S.C. 154(b) by 570 days.

(21) Appl. No.: 11/260,445

(22) Filed: Oct. 27, 2005

(65) Prior Publication Data

US 2007/0076162 A1   Apr. 5, 2007

(30) Foreign Application Priority Data

Mar. 10, 2005   (KR) .................. 10-2005-0020091

(51) Int. Cl.
  *G02F 1/133* (2006.01)
(52) U.S. Cl. ............................................. 349/34
(58) Field of Classification Search ............... None
  See application file for complete search history.

(56) References Cited

U.S. PATENT DOCUMENTS

| | | | |
|---|---|---|---|
| 6,861,614 B1 * | 3/2005 | Tanabe et al. ........... | 219/121.66 |
| 7,253,032 B2 * | 8/2007 | Yamazaki et al. ........... | 438/149 |
| 7,312,418 B2 * | 12/2007 | Tanabe et al. ........... | 219/121.65 |
| 2003/0147019 A1 * | 8/2003 | Sasaki ....................... | 349/43 |

FOREIGN PATENT DOCUMENTS

JP   2004-230458   8/2004

OTHER PUBLICATIONS

English Abstract for Publication No. 2004-230458.

* cited by examiner

*Primary Examiner*—Sung H Pak
(74) *Attorney, Agent, or Firm*—F. Chau & Associates, LLC

(57) ABSTRACT

A system for manufacturing a flat panel display is provided including a display panel moving unit, and a laser unit for generating a laser beam, wherein the laser unit comprises a mask for selectively passing the laser beam, a reducing lens for reducing the laser beam having passed the mask, and a blocking part for substantially preventing an external air current from flowing into a space between the mask and the reducing lens where a focus of the laser beam is formed.

15 Claims, 2 Drawing Sheets

SYSTEM FOR MANUFACTURING A FLAT PANEL DISPLAY

CROSS-REFERENCE TO RELATED APPLICATION

This application claims priority to and the benefit of Korean Patent Application 10-2005-0020091 filed in the Korean Intellectual Property Office on Mar. 10, 2005, the entire content of which is incorporated herein by reference.

BACKGROUND OF THE INVENTION (a) Field of the Invention

The present invention relates to a system for manufacturing a flat panel display, and more particularly, to an apparatus for crystallizing amorphous silicon (a-Si) while a thin film transistor array (TFT-Array) panel is formed (b) Description of Related Art Liquid crystal displays (LCDs) are widely used in electronic devices. An LCD includes a pair of display panels, which include field generating electrodes formed thereon, and a liquid crystal layer disposed between the pair of display panels. Orientations of liquid crystal molecules of the liquid crystal layer are controlled by voltages supplied to the field generating electrodes. An image may be displayed by controlling a transmittance of a light passing through the liquid crystal layer according to the orientation of the liquid crystal molecules.

Such an LCD may be manufactured by the following processes: Common electrodes and color filters are formed on an upper display panel, and pixel electrodes and thin film transistors are formed on a lower display panel. An alignment layer for aligning liquid crystal molecules is coated on the upper and lower display panels. An active area is defined in a closed-loop shape on the lower display panel by applying a sealant. A liquid crystal is disposed in the active area. The pair of display panels is assembled in a vacuum state, and the sealant is hardened.

Performance of the thin film transistors formed on the lower display panel is important. To improve the performance of the thin film transistors formed on the lower display panel, it is an important that an a-Si (amorphous silicon) of a semiconductor layer of the thin film transistors is crystallized.

A sequential lateral solidification (SLS) type system using a laser is typically used for crystallizing the a-Si. Such an SLS type system includes a moving unit for moving the lower display panel, and a laser unit for irradiating the a-Si of the lower display panel.

The moving unit includes a frame having a rail, a guider adapted to move along the rail, an air bearing disposed between the rail and the guider, and a stage mounted to the guider and holding the display panel.

The laser unit includes a laser source for generating a laser beam, a control lens for controlling an amount of energy of the laser beam, a convergence lens for converging the controlled laser beam, a mask for selectively passing the converged laser beam, and a reducing lens for reducing the passed laser beam to a predetermined focus so as to irradiate the a-Si with the laser beam.

Accordingly, the laser beam irradiates the a-Si of the lower display panel via the laser source, the control lens, the convergence lens, the mask, and the reducing lens.

At the same time, the stage loading the lower display panel moves in a predetermined manner.

The SLS type system may have following problems.

A phenomenon may occur in which a focus of the laser beam formed between the mask and the reducing lens is shaken due to air currents, for example, generated by a movement of the stage, an air current generated by the air bearing, and/or a natural convection due to heat generated from the mask.

The laser beam passing between the mask and the reducing lens is directly affected by the air currents, and accordingly the focus formed between the mask and the reducing lens may be easily shaken.

In a case that the focus formed between the mask and the reducing lens is shaken, a depth of focus (DOF) of the laser beam irradiating the a-Si may not be maintained at a predetermined DOF, and accordingly a device produced thereby may need to be rejected.

Further more, to precisely define a melted region of the a-Si, a resolution of the lens needs to be increased, and consequently the DOF must be decreased. If the focus formed between the mask and the reducing lens is shaken, it may be difficult that such decreased DOF is maintained, Therefore, a need exists for a system for reducing air currents in a process for manufacturing a flat panel display.

SUMMARY OF THE INVENTION

An exemplary system for manufacturing a flat panel display according to an embodiment of the present invention includes a display panel moving unit, and a laser unit for generating a laser beam in the direction of the display panel moving unit. The laser unit includes a mask for selectively passing the laser beam, a reducing lens for focusing the laser beam having passed the mask, and a blocking part for substantially preventing an external air current from flowing into a space between the mask and the reducing lens where a focus of the laser beam is formed.

According to an embodiment of the present invention, the blocking part may include a hollow body having an opened upper portion and a closed lower portion, wherein an inner surface of the opened upper portion is fixed to an outer surface of the mask, and the reducing lens is disposed within an inner portion of the hollow body.

According to an embodiment of the present invention, the inner portion of the hollow body is maintained at a predetermined vacuum.

According to an embodiment of the present invention, the inner portion of the hollow body is filled with an inert gas.

According to an embodiment of the present invention, the hollow body is formed of either a transparent material or a semitransparent material.

According to an embodiment of the present invention, the hollow body is formed of an opaque material, and a beam passing part through which the laser beam passes is provided to the closed lower portion of the hollow body.

According to an embodiment of the present invention, the beam passing part includes a passing hole formed at a predetermined portion of the closed lower portion of the hollow body through which the laser beam passes, and a window provided in the passing hole to close the passing hole, the window formed of a transparent material.

According to an embodiment of the present invention, the window is formed of quartz.

According to an embodiment of the present invention, the blocking part includes a hollow body having an opened upper portion and an opened bottom portion, wherein an inner surface of the opened upper portion is fixed to an outer surface of the mask, and an inner surface of the opened lower portion is fixed to an outer surface of the reducing lens.

According to an embodiment of the present invention, the moving unit includes a frame on which a rail is disposed, a guider for moving along the rail, an air bearing disposed between the rail and the guider such that the guider is positioned apart from the rail by a predetermined distance, and a display panel stage mounted to the guider, wherein the stage includes an air current guider provided at an edge thereof so as to substantially prevent an air current generated by the air bearing from flowing over the stage, the air current guider inclined toward the frame.

According to an embodiment of the present invention, the air current guider has a round shape.

BRIEF DESCRIPTION OF THE DRAWINGS

Embodiments of the present invention will hereinafter be described in detail with reference to the accompanying drawings in which.

DETAILED DESCRIPTION OF PREFERRED EMBODIMENTS

Figure 1:
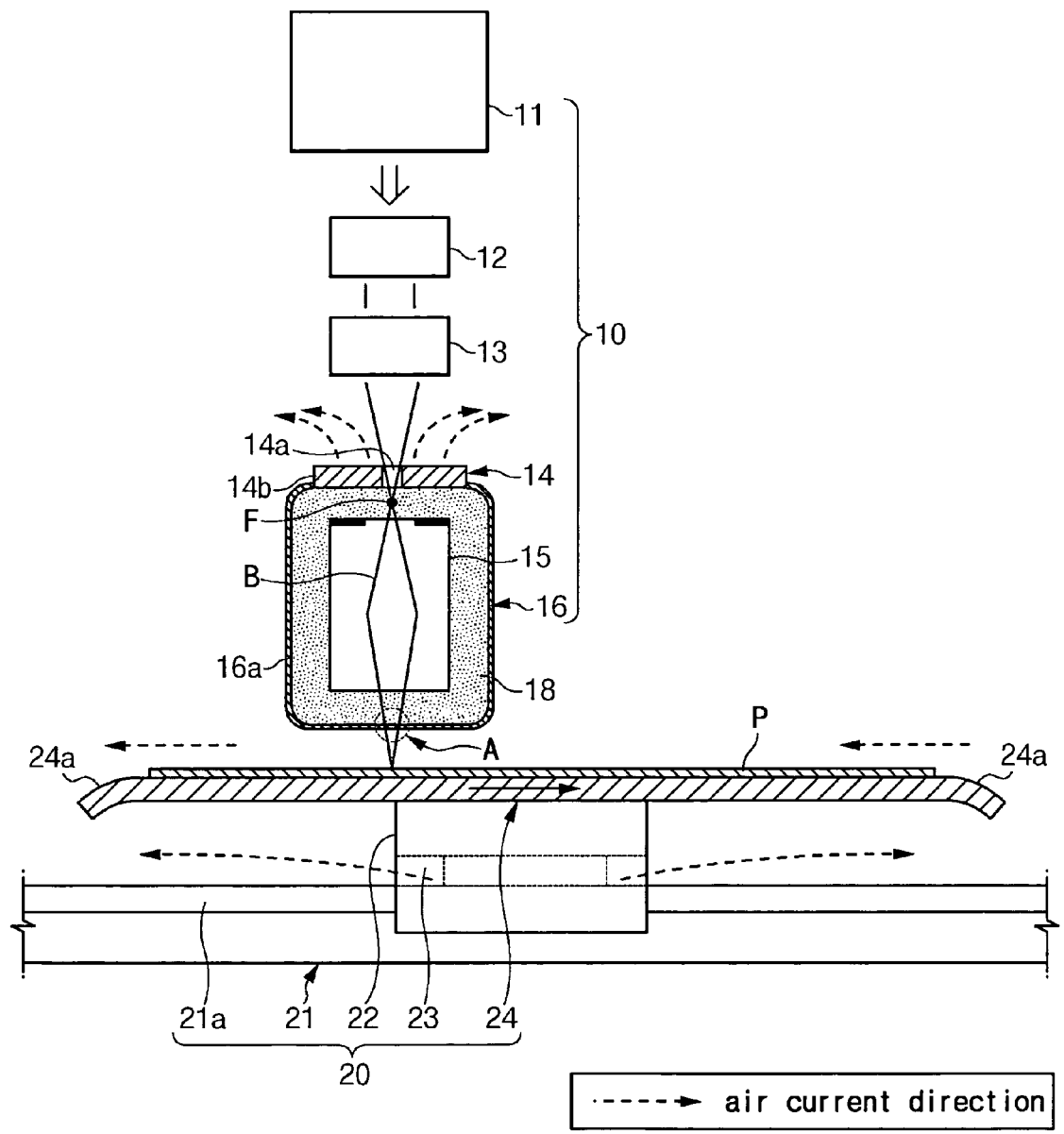
FIG. 1 is a schematic view of a system for manufacturing a flat panel display according to an embodiment of the present invention.
Figure 2:
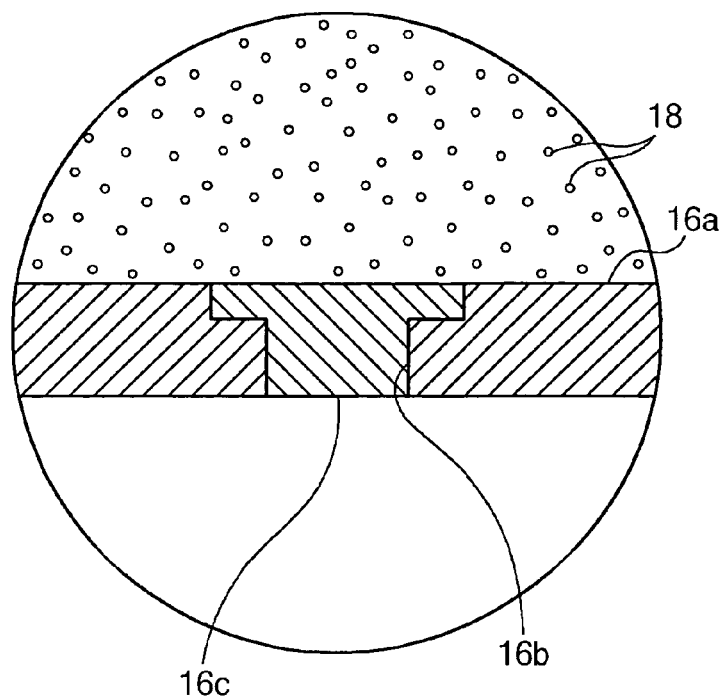
FIG. 2 is an enlarged view of part "A" in FIG. 1.

FIG. 1 is a schematic view of a system for manufacturing a flat panel display according to an embodiment of the present invention, and FIG. 2 is an enlarged view of part "A" in FIG. 1.

As shown in FIG. 1, a system for manufacturing a flat panel display according to an embodiment of the present invention includes a laser unit 10, and a moving unit 20 for moving a display panel P on which an amorphous material is coated.

The laser unit 10 includes a laser source 11, a control lens 12, a convergence lens 13, a mask 14, a focal reducing lens 15, and a locking part 16, so as to irradiate an amorphous material with laser beam B.

The laser source 11 generates the laser beam B, the control lens 12 controls an amount of energy of the generated laser beam B, and the convergence lens 13 converges the controlled laser beam B.

The mask 14 selectively passes the converged laser beam B, and may include a transmitting portion 14a and a blocking portion 14b.

The focal reducing lens 15 focusing the laser beam B having passed through the mask such that the laser beam B irradiates to the amorphous material of the display panel P.

The blocking part 16 prevents an external air current from flowing into a space between the mask 14 and the focal reducing lens 15 where a focus F of the laser beam B is formed.

For example, such a blocking part 16 includes a hollow body 16a having an opened upper portion and a closed lower portion, an inner surface of the opened upper portion of the hollow body 16a is fixed to an outer surface of the mask 14, and the focal reducing lens 15 is positioned at an inner portion of the hollow body 16a.

The inner portion of the hollow body 16a may, for example, be maintained at a predetermined vacuum, or the inner portion of the hollow body 16a may be filled with an inert gas 18, so as to substantially prevent a natural convection due to a heat.

The hollow body 16a may, for example, be formed of either a transparent material or a semitransparent material such that the laser beam B can pass there through.

The hollow body 16a may be formed of an opaque material. For a hollow body 16a formed of the opaque material (e.g., metal etc.), a beam passing part A through which the laser beam B passes is disposed in the closed lower portion of the hollow body 16a.

As shown in FIG. 2, the beam passing part A includes a passing hole 16b and a window 16c. The passing hole 16b is formed at a predetermined portion of the closed lower portion of the hollow body 16a through which the laser beam B passes. The window 16c is disposed in the passing hole 16b to close the passing hole 16b. The window 16c is formed of a transparent material.

Such a window 16c can be formed of, for example, quartz that can be easily machined as a flat surface as so to substantially prevent a scattering of the laser beam B.

According to an embodiment of the present invention, since the blocking part 16 is positioned between the mask 14 and the reducing lens 15, the laser beam B that is passing between the mask 14 and the reducing lens 15 is not affected by an air current.

Consequently, since the focus of the laser beam B is formed between the mask 14 and the reducing lens 15, a depth of focus (DOF) of laser beam B irradiating an amorphous silicon (a-Si) of the display panel P is increased. In addition, since the DOF is increased (e.g., an available error of focus becomes broad), a region where the a-Si is melted can be precisely controlled.

As shown in FIG. 1, the moving unit 20 includes a frame 21 on which a rail 21a is formed, a guider 22 moving along the rail 21a, an air bearing 23, and a stage 24.

The air bearing 23 is mounted between the rail 21a and the guider 22 such that the guider 22 is positioned apart from the rail 21a by a predetermined distance, and accordingly, the air bearing 23 can decrease an external vibration transmitted to the guider 22 and can increase a speed of the guider 22.

The stage 24 is mounted to the guider 22 and holds the display panel P.

The stage 24 includes an air current guider 24a provided at an edge thereof so as to substantially prevent an air current due to the air bearing 23 from flowing over the stage 24. The air current guider 24a is inclined in a downward direction.

Such an air current guider 24a may have a round shape so as to prevent a vortex from being formed.

According to an embodiment of the present invention, the air current guider 24a is provided at the edge of the stage 24, and accordingly, air currents, such as the air current generated from the air bearing 23 and an air current generated from a cooling fan (not shown) disposed on a lower portion of the stage 24 so as to cool a controller (not shown), can be substantially prevented from flowing over the stage 24.

Consequently, since such air currents do not flow over the stage 24, the laser unit 10 and the laser beam B disposed above the stage 24 are substantially unaffected by the air currents.

Although in the blocking part 16 and the air current guide 24a shown in FIG. 1, only one of the two members can be implemented, for example, so as to reduce cost.

A system for manufacturing a flat panel display according to an embodiment of the present invention will hereinafter be described in detail with reference to FIG. 3.

Figure 3:
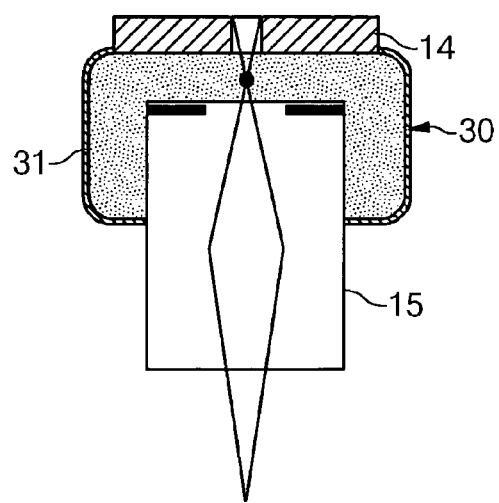
FIG. 3 is a schematic view of a system for manufacturing a flat panel display according to other embodiment of the present invention.

FIG. 3 is a schematic view of a system for manufacturing a flat panel display according to an embodiment of the present invention.

Elements of the system described with respect to FIG. 3 are substantially similar to those of FIG. 1, except as described herein with respect to blocking part 30.

The blocking part 30 includes a hollow body 31 having an opened upper portion and an opened bottom portion. An inner surface of the opened upper portion is fixed to an outer surface of the mask 14, and an inner surface of the opened lower portion is fixed to an outer surface of the reducing lens 15.

The hollow body 31a does not surround a lower surface of the reducing lens 15, and no separate beam passing part (see a reference symbol "A" in FIG. 1) is provided in the hollow body 31.

According to an embodiment of the present invention, a blocking part is provided between a mask and a reducing lens, and a laser beam passing between the mask and the reducing lens is not affected by air currents.

A focus of the laser beam formed between the mask and the reducing lens is not shaken by air currents, a DOF of the laser beam irradiating an a-Si of a display panel is increased, and an available error range of focus becomes broadened, such that a region where the a-Si is melted can be precisely controlled.

In addition, according to an embodiment of the present invention, since an air current guider is provided at an edge of a stage, air currents due to an air bearing etc. can be substantially prevented from flowing over a stage.

While embodiments of the present invention have been described herein, it is to be understood that the invention is not limited to disclosed embodiments, but, on the contrary, is intended to cover various modifications and equivalent arrangements included within the spirit and scope of the description.

What is claimed is:

1. A system for manufacturing a flat panel display, comprising:
   a laser unit for generating a laser beam,
   wherein the laser unit comprises,
      a mask for selectively passing the laser beam,
      a focal reducing lens for focusing the laser beam having passed the mask, and
      a blocking part for substantially preventing an external air current from flowing into a space between the mask and the focal reducing lens,
   wherein the blocking part comprises,
   a hollow body having an opened upper portion and a closed lower portion, and
   an inner surface of the opened upper portion is fixed to an outer surface of the mask,
   wherein the reducing lens is disposed within an inner portion of the hollow body.

2. The system of claim 1, wherein the inner portion of the hollow body is maintained at a predetermined vacuum.

3. The system of claim 1, wherein the inner portion of the hollow body is filled with an inert gas.

4. The system of claim 1, wherein the hollow body is formed of a transparent material or a semitransparent material.

5. The system of claim 1, wherein the hollow body is formed of an opaque material, and a beam passing part through which the laser beam passes is disposed through the closed lower portion of the hollow body.

6. The system of claim 5, wherein the beam passing part comprises:
   a passing hole formed in a predetermined portion of the closed lower portion of the hollow body through which the laser beam passes; and
   a window disposed in the passing hole to close the passing hole, wherein the window is formed of a transparent material.

7. The system of claim 6, wherein the transparent material is quartz.

8. The system of claim 1, wherein the blocking part comprises:
   a hollow body having an opened upper portion and an opened bottom portion;
   an inner surface of the opened upper portion is fixed to an outer surface of the mask; and
   an inner surface of the opened lower portion is fixed to an outer surface of the reducing lens.

9. The system of claim 8, wherein the inner portion of the hollow body is maintained at a predetermined vacuum.

10. The system of claim 8, wherein the inner portion of the hollow body is filled with an inert gas.

11. The system of claim 1, further comprising a display panel moving unit wherein the display panel moving unit comprises:
    a frame on which a rail is disposed;
    a guider for moving along the rail;
    an air bearing disposed between the rail and the guider such that the guider is positioned apart from the rail by a predetermined distance; and
    a display panel stage mounted to the guider,
    wherein the display panel stage comprises an air current guider provided at an edge thereof so as to substantially prevent an air current generated by the air bearing from flowing over the stage, the air current guider inclined towards the frame.

12. The system of claim 11, wherein the air current guider has a round shape.

13. A system for manufacturing a flat panel display, comprising:
    a display panel moving comprising,
       a frame on which a rail is disposed,
       a guider for moving along the rail;
       an air bearing disposed between the rail and the guider such that the guider is positioned apart from the rail by a predetermined distance; and
       a display panel stage mounted to the guider,
    wherein the display panel stage comprises an air current guider provided at an edge thereof so as to substantially prevent an air current generated by the air bearing from flowing over the stage, the air current guider inclined towards the frame.

14. A system for manufacturing a flat panel display, comprising:
    a display panel moving unit; and
    a laser unit for generating a laser beam,
    wherein the laser unit comprises,
       a laser source for generating the laser beam in a direction of the display panel moving unit,
       a control lens for controlling an amount of energy of the laser beam,
       a convergence lens for converging the laser beam,
       a mask for selectively passing the laser beam;
       a reducing lens for focusing the passed laser beam having passed the mask, and
       a blocking part for substantially preventing an external air current from flowing into a space between the mask and the reducing lens,
    wherein the blocking part comprises a hollow body having an opened upper portion and a closed lower portion, an inner surface of the opened upper portion fixed to an outer surface of the mask, and the reducing lens disposed within an inner portion of the hollow body,
wherein the moving unit comprises
   a frame on which a rail is disposed,
   a guider for moving along the rail,
   an air bearing disposed between the rail and the guider such that the guider is positioned apart from the rail by a predetermined distance; and
   a display panel stage mounted to the guider,
wherein the stage comprises an air current guider provided at an edge thereof so as to substantially prevent an air current generated by the air bearing from flowing over the stage, the air current guider inclined toward the frame.

15. The system of claim 1, wherein a focus of the laser beam is formed between the mask and the reducing lens.

* * * * *